United States Patent
Mast et al.

(10) Patent No.: US 8,085,031 B2
(45) Date of Patent: Dec. 27, 2011

(54) DEVICE FOR SUPPLYING POWER TO MEASURING SENSORS AND TRANSMITTING A SYNCHRONOUS CLOCK SIGNAL THERETO

(75) Inventors: Jochen Mast, Heidelberg (DE); Stefan Weiers, Heidelberg (DE); Klaus-Georg Müller, Wilhelmsfeld (DE)

(73) Assignee: ABB Patent GmbH, Ladenburg (DE)

( * ) Notice: Subject to any disclaimer, the term of this patent is extended or adjusted under 35 U.S.C. 154(b) by 422 days.

(21) Appl. No.: 11/887,911

(22) PCT Filed: Mar. 25, 2006

(86) PCT No.: PCT/EP2006/002763
§ 371 (c)(1),
(2), (4) Date: Oct. 5, 2007

(87) PCT Pub. No.: WO2006/105880
PCT Pub. Date: Oct. 12, 2006

(65) Prior Publication Data
US 2009/0058394 A1    Mar. 5, 2009

(30) Foreign Application Priority Data
Apr. 7, 2005 (DE) .................. 10 2005 015 942

(51) Int. Cl.
*H01F 30/12* (2006.01)
*H02J 1/10* (2006.01)
(52) U.S. Cl. .......................... 323/361; 363/65
(58) Field of Classification Search .............. 323/361; 363/17, 21.02, 21, 12, 65, 67, 68, 71, 123, 363/131, 63
See application file for complete search history.

(56) References Cited

U.S. PATENT DOCUMENTS

| | | | |
|---|---|---|---|
| 4,295,085 A * | 10/1981 | Lafuze | 318/721 |
| 4,330,816 A * | 5/1982 | Imazeki et al. | 363/21.05 |
| 5,973,941 A | 10/1999 | Zaim | |
| 6,590,788 B2 * | 7/2003 | Mercier | 363/21.06 |
| 6,707,287 B2 * | 3/2004 | Takeda et al. | 324/127 |
| 6,809,939 B1 * | 10/2004 | Yang | 363/21.14 |
| 6,862,193 B2 * | 3/2005 | Nakata | 363/15 |
| 2003/0076086 A1 | 4/2003 | Takeda et al. | |
| 2003/0142773 A1 * | 7/2003 | Shirota et al. | 375/373 |

FOREIGN PATENT DOCUMENTS

| | | |
|---|---|---|
| DE | 26 14 075 A1 | 9/1977 |
| DE | 39 02 529 C2 | 9/1989 |
| EP | 1 396 728 A2 | 3/2004 |
| WO | WO 93/23915 A1 | 11/1993 |

OTHER PUBLICATIONS

PCT/ISA/210 for PCT/EP2006/002463 dated Sep. 6, 2006.
German Search Report dated Jan. 19, 2006.

* cited by examiner

*Primary Examiner* — Adolf Berhane
*Assistant Examiner* — Emily Pham
(74) *Attorney, Agent, or Firm* — Buchanan Ingersoll & Rooney PC

(57) ABSTRACT

The invention relates to a device for supplying power to measuring sensors and transmitting a synchronous clock signal thereto, in particular, for a low-voltage switchgear, with a power supply unit (10) whose output signals are transmitted to the measuring sensors via transformers providing the isolation. A quartz-controlled oscillation circuit arrangement (quartz-controlled clock generator) is provided whose output signals are supplied to the power supply unit (10) so that the clock frequency of the power supply unit output signals is the same for the primary sides of the transformers (11, 12, 13), the frequency lying within the operating range of the transformers (11, 12, 13).

17 Claims, 2 Drawing Sheets

DEVICE FOR SUPPLYING POWER TO MEASURING SENSORS AND TRANSMITTING A SYNCHRONOUS CLOCK SIGNAL THERETO

The invention relates to a device for supplying power to measuring sensors and transmitting a synchronous clock signal thereto, such as for a low-voltage assembly, for example.

Low-voltage switchgear assemblies require measuring sensors which measure the voltage and the current within the switchgear assembly. These measuring sensors are at operating potential, with the result that the measurement methods generally used in switchgear assemblies are based on converting the output variable of the sensors, via magnetic converters, into a measurement signal with no DC level, which is then digitized centrally and further-processed. Measurement methods which detect the measured variable directly on the primary side, for example shunts, or measurements which are based on shunts, are hardly used.

The magnetic converters which are predominantly used for measuring current and voltage in three-phase systems have, on the secondary side, principle-based nonlinearities and phase shifts in comparison with the input signal. This results, in particular in the case of vectorial evaluation of current and voltage in the three-phase systems, in measurement errors.

In order to carry out a precise measurement of current, voltage and temperature within, for example, starter modules (for starting motors), measurement modules have been developed which measure directly on the power side. The isolation from the measurement circuit takes place only once the measurement data have been digitized.

In order to be able to calculate the power or a ground-fault current in the three-phase systems, sampling of the measured variables which is synchronous in time is required in all three phases. If, as is generally conventional, a quartz oscillator is used on each measurement module for clock generation, differences in the sampling time result from the tolerance of the quartz crystals and their uncorrelated phase angle with respect to one another. Since, in the case of use in low-voltage switchgear assemblies, a dielectric strength of a few kV is required for the measurement circuits with respect to one another, there is a not inconsiderable degree of complexity in terms of circuitry in order to distribute a centrally produced reference clock signal between three measurement modules in isolated fashion.

The object of the invention is to provide a device of the type mentioned at the outset in order to achieve synchronization of the measurement module clocks by means of arrangements which are already provided.

This object is achieved according to exemplary embodiments of the invention.

According to the invention, a quartz-controlled clock generator is in this case provided, whose output signals are fed to the switched mode power supply, with the result that the clock frequency of the switched mode power supply output signals is the same for the primary sides of the transformers, the frequency being within the working range of the transformers.

In the device according to the invention, it is therefore possible to use the switched mode power supply which is already provided for supplying power to three measurement modules in isolated fashion in order to achieve synchronization of the measurement module clocks via the same arrangement.

In accordance with an advantageous configuration of the invention, the secondary sides of the transformers can be connected to in each case one circuit arrangement, with which the edge signals of the clock frequency of the primary sides are recovered. This means that the signals which are output on the secondary sides of the transformers are brought into the original, primary-side form.

Furthermore, a further circuit arrangement is provided to which the edge signals can be fed and which feeds the frequency of the edge signals, multiplied, to the measuring sensors.

Further advantageous configurations of the invention and further improvements are described in the further dependent claims.

The invention as well as further advantageous configurations and improvements of the invention and further advantages will be explained and described in more detail with reference to the drawing, which schematically illustrates an exemplary embodiment of the invention and in which.

Figure 1:
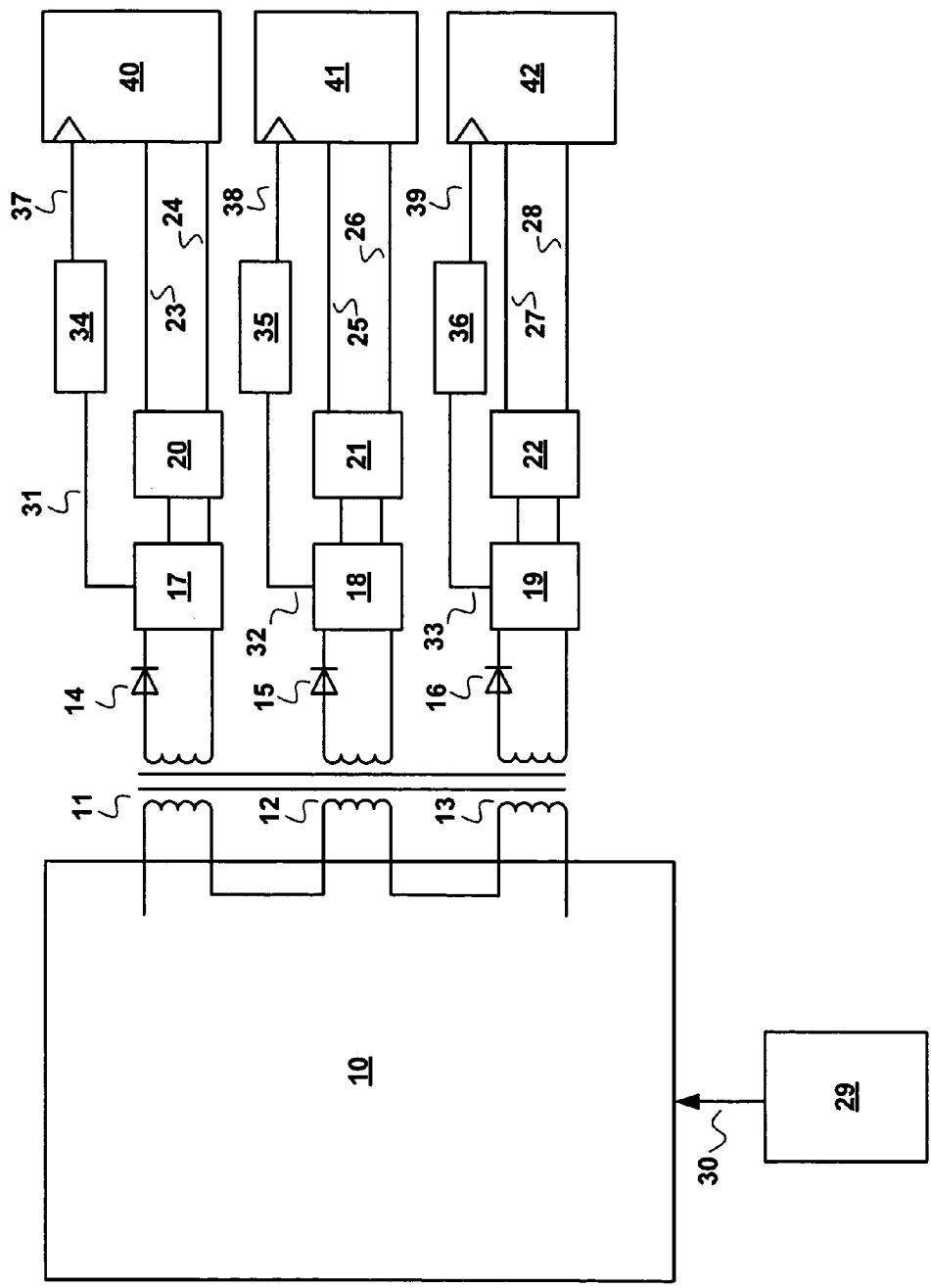
FIG. 1 shows a schematic interconnection of the device, with measuring sensors, according to an exemplary embodiment of the invention.

The device comprises a switched mode power supply 10, whose output signals are fed to a number of transformers 11, 12 and 13 which corresponds to the number of phases where measurements take place. The switched mode power supply 10 is designed using known technology, preferably using flyback topology. On the secondary side, the output voltage of the transformers 11, 12 and 13 is rectified via diodes 14, 15 and 16 and in each case fed to a circuit arrangement 20, 21, 22, which stabilizes the rectified voltage and makes it available as an output voltage between the terminals 23, 24; 25, 26; 27, 28; these output voltages are used for the power supply to sensors 40, 41, and 42, which are also known as measurement modules.

An oscillator circuit arrangement 29 is associated with the switched mode power supply 10, and its output signals are fed to the switched mode power supply 10 in accordance with the arrow direction 30, with the result that the output signals of the switched mode power supply which are fed to the primary side of the transformers 11, 12 and 13 are clocked.

Further circuit arrangements 17, 18, 19, in which the edge signals of the secondary-side output signals are detected, are located between the secondary side of the transformers 11 to 13 and the circuit arrangements 20 to 22, with the result that the clock signals are again matched to those of the oscillator circuit arrangement 29. On the secondary side, the edge signal of the primary clock is therefore recovered.

The signal information recovered in the circuit arrangements 17, 18 and 19 is fed, via signal lines 31, 32 and 33, on each measurement module 40, 41, and 42 for phase-locked synchronization, to a PLL circuit arrangement 34, 35 and 36, as a result of which an output signal 37, 38 and 39 is produced whose frequency is a multiple of the input frequency and can therefore act as a clock signal of analog-to-digital converters of the measurement modules 40, 41, and 42.

The clock signals of the three measurement modules 40, 41, and 42 are therefore coupled to one another in phase-locked fashion and therefore make it possible for the measured variables to be sampled in clock-synchronous fashion in all three measurement modules 40, 41, and 42.

The abbreviation PLL means a phase-locked loop circuit arrangement.

Figure 2:
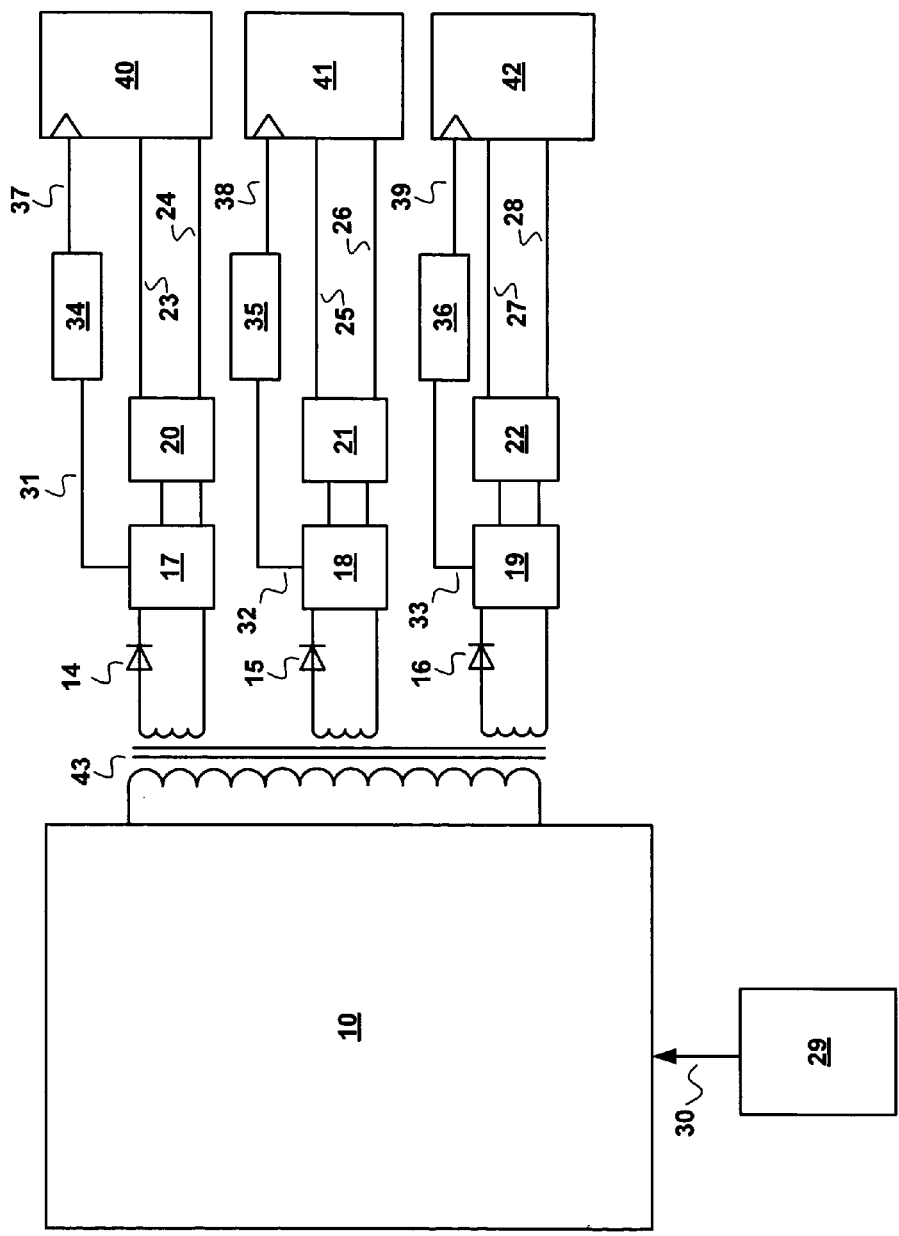
FIG. 2 shows a schematic interconnection of the device, with measuring sensors, according to a further exemplary embodiment of the invention.

The transformers 11, 12 and 13 can also be replaced by a series circuit comprising two part-transformers, as a result of which the required dielectric strength is achieved. It is naturally also possible for only one single transformer 43, as illustrated in FIG. 2, to be provided which has three secondary windings, whose output signals are each rectified via the diodes 14, 15 and 16 and further-processed by the other circuit arrangements.

The invention claimed is:

1. A device for powering and synchronously clocking measuring sensors, the device comprising:
at least one isolation transformer comprising at least one primary side and a plurality of secondary sides;
a switched mode power supply configured to output a plurality of signals and to transmit the output signals to a corresponding one of the measuring sensors, via the at least one primary side of the at least one isolation transformer and a respective one of the secondary sides to power the measuring sensors in accordance with the corresponding one of the output signals; and an oscillation circuit arrangement configured to transmit clock signals to the switched mode power supply,
wherein the switched mode power supply, in accordance with the clock signals output from the oscillation circuit arrangement, is configured to transmit each of the output signals at the same clock frequency to the at least one primary side of the at least one isolation transformer, the frequency being within the working range of the at least one transformer, to control a respective sampling frequency of the measuring sensors based on the frequency of a corresponding one of the output signals and synchronize the sampling frequencies of the measuring sensors.

2. The device as claimed in claim 1, wherein the at least one isolation transformer comprises at least two series-connected transformers.

3. The device as claimed in claim 1, wherein the at least one transformer comprises a single transformer, and
wherein the at least one primary side is a single primary side.

4. The device as claimed in claim 1, comprising:
rectifiers configured to rectify the output signals output from the secondary sides of the at least one isolation transformer, respectively; and
a circuit arrangement configured to stabilize the rectified output signals.

5. The device as claimed in claim 1, comprising:
a plurality of first circuit arrangements, each first circuit arrangement being connected to a corresponding one of the secondary sides of the at least one isolation transformer,
wherein each first circuit arrangement is configured to detect an edge of the clock frequency of a corresponding one of the output signals output from the corresponding one of the secondary sides, and to output an edge signal indicating the clock frequency of the corresponding one of the output signals at the at least one primary side.

6. The device as claimed in claim 5, comprising:
a plurality of second circuit arrangements connected to a corresponding one of the plurality of first circuit arrangements and corresponding one of the measuring sensors, respectively,
wherein each second circuit arrangement is configured to receive a corresponding one of the edge signals output from the corresponding one of the first circuit arrangements, and to output a multiple of the clock frequency indicated in the corresponding one of the received edge signals to the corresponding one of the measuring sensors.

7. The device as claimed in claim 1, wherein the measuring sensors and the device are in a low-voltage assembly.

8. The device as claimed in claim 1, wherein the number of secondary sides is three.

9. The device as claimed in claim 3, wherein the number of secondary sides is three.

10. The device as claimed in claim 1, wherein the at least one isolation transformer comprises a plurality of isolation transformers arranged in parallel to the switched mode power supply, and
wherein each isolation transformer has a respective one of the at least one primary side and a respective one of the plurality of the secondary sides.

11. The device as claimed in claim 1, wherein the oscillation circuit arrangement comprises a quartz configured to control generation of the clock signals.

12. The device as claimed in claim 6, wherein each second circuit arrangement comprises a respective phase locked loop configured to receive the corresponding one of the edge signals output from the corresponding one of the first circuit arrangements, and to output the multiple of the clock frequency indicated in the corresponding one of the received edge signals to the corresponding measuring sensors.

13. The device as claimed in claim 1, wherein each one of the output signals is a different phase of a multi-phase signal.

14. A system, comprising:
measuring sensors configured to sample at least one variable at a sampling frequency; and
a device for powering and synchronously clocking the measuring sensors, the device comprising:
at least one isolation transformer comprising at least one primary side and a plurality of secondary sides;
a switched mode power supply configured to output a plurality of signals and to transmit the output signals to a corresponding one of the measuring sensors, via the at least one primary side of the at least one isolation transformer and a respective one of the secondary sides to power the measuring sensors in accordance with the corresponding one of the output signals; and
an oscillation circuit arrangement configured to transmit clock signals to the switched mode power supply,
wherein the switched mode power supply, in accordance with the clock signals output from the oscillation circuit arrangement, is configured to transmit each of the output signals at the same clock frequency to the at least one primary side of the at least one isolation transformer, the frequency being within the working range of the at least one transformer, to control a respective sampling frequency of the measuring sensors based on the frequency of a corresponding one of the output signals and synchronize the sampling frequencies of the measuring sensors.

15. The system of claim 14, comprising a low-voltage assembly, wherein the measuring sensors and the device are in the low-voltage assembly.

16. A method for powering and synchronously clocking measuring sensors, comprising:
generating, from a switched mode power supply, a plurality of output signals that are respectively clocked in accordance with a clock signal output from an oscillator circuit arrangement, the clock signal output having a frequency;
powering each measuring sensor from a corresponding one of the generated output signals;
recovering, from each of the output signals, a respective edge signal having a frequency, wherein the frequency of each of the edge signals is the same as the frequency of the clock signal output; and controlling a respective sampling frequency of the measuring sensors based on a respective one of the recovered edge signals so as to synchronize the sampling frequencies.

17. The method of claim 16, wherein each one of the output signals is a different phase of a multi-phase signal.

* * * * *